United States Patent
Kuroda et al.

(10) Patent No.: US 12,398,298 B2
(45) Date of Patent: Aug. 26, 2025

(54) TEMPORARY PROTECTIVE FILM FOR PRODUCING SEMICONDUCTOR DEVICE, REEL BODY, AND METHOD FOR PRODUCING SEMICONDUCTOR DEVICE

(71) Applicant: Resonac Corporation, Tokyo (JP)

(72) Inventors: Takahiro Kuroda, Tokyo (JP); Tomohiro Nagoya, Tokyo (JP); Naoki Tomori, Tokyo (JP)

(*) Notice: Subject to any disclaimer, the term of this patent is extended or adjusted under 35 U.S.C. 154(b) by 1076 days.

(21) Appl. No.: 17/288,913

(22) PCT Filed: Nov. 7, 2019

(86) PCT No.: PCT/JP2019/043750
§ 371 (c)(1),
(2) Date: Apr. 27, 2021

(87) PCT Pub. No.: WO2020/096011
PCT Pub. Date: May 14, 2020

(65) Prior Publication Data
US 2021/0395577 A1 Dec. 23, 2021

(30) Foreign Application Priority Data
Nov. 9, 2018 (JP) .................. 2018-211552

(51) Int. Cl.
*C09J 7/38* (2018.01)
*C09J 7/25* (2018.01)
(Continued)

(52) U.S. Cl.
CPC ............. *C09J 7/385* (2018.01); *C09J 7/25* (2018.01); *C09J 133/10* (2013.01); *C09J 133/14* (2013.01);
(Continued)

(58) Field of Classification Search
CPC ... C09J 7/385; C09J 7/25; C09J 133/10; C09J 133/14; C09J 133/20; C09J 2433/00; H01L 21/568; H01L 21/6836
See application file for complete search history.

(56) References Cited

U.S. PATENT DOCUMENTS 6,700,185 B1  3/2004  Kawai et al.
7,449,367 B2  11/2008  Matsuura et al.
(Continued)

FOREIGN PATENT DOCUMENTS

CN     1698200     11/2005
CN     101298543   11/2008
(Continued)

OTHER PUBLICATIONS

International Preliminary Report on Patentability with Written Opinion dated May 20, 2021 for PCT/JP2019/043750.
(Continued)

*Primary Examiner* — Scott R. Walshon
(74) *Attorney, Agent, or Firm* — SOEI PATENT & LAW FIRM

(57) ABSTRACT

A temporary protective film for temporarily protecting a surface of a semiconductor substrate that is opposite to a surface on which a semiconductor element is mounted. The temporary protective film includes an adhesive layer containing acrylic rubber. When the temporary protective film is attached to a copper alloy plate at 25° C. so that the adhesive layer is in contact with the copper alloy plate, and the obtained laminate is sequentially heated at 180° C. for 60 minutes and at 200° C. for 60 minutes, a 90-degree peeling strength of the temporary protective film against the copper alloy plate is 5 N/m or more at 25° C. before heating the laminate and 150 N/m or less at 50° C. after heating the laminate.

11 Claims, 3 Drawing Sheets

(51) Int. Cl.
   *C09J 133/10*   (2006.01)
   *C09J 133/14*   (2006.01)
   *C09J 133/20*   (2006.01)
   *H01L 21/56*    (2006.01)
   *H01L 21/683*   (2006.01)

(52) U.S. Cl.
   CPC .......... *C09J 133/20* (2013.01); *H01L 21/568* (2013.01); *H01L 21/6836* (2013.01); *C09J 2433/00* (2013.01)

(56) References Cited

U.S. PATENT DOCUMENTS

| | | | |
|---|---|---|---|
| 2003/0145949 | A1 | 8/2003 | Tanaka et al. |
| 2004/0124544 | A1 | 7/2004 | Kawai et al. |
| 2006/0043607 | A1 | 3/2006 | Matsuura et al. |
| 2014/0252646 | A1 | 9/2014 | Hung et al. |
| 2018/0327637 | A1* | 11/2018 | Yamagishi .............. B32B 27/40 |
| 2019/0103298 | A1 | 4/2019 | Hayashishita |
| 2020/0118841 | A1 | 4/2020 | Tomori et al. |

FOREIGN PATENT DOCUMENTS

| | | |
|---|---|---|
| CN | 101490194 | 7/2009 |
| CN | 101796153 | 8/2010 |
| CN | 102061136 | 5/2011 |
| CN | 102134452 | 7/2011 |
| CN | 102134453 | 7/2011 |
| CN | 102414017 | 4/2012 |
| JP | H2-146144 | 12/1990 |
| JP | H5-092534 | 4/1993 |
| JP | H5-129473 | 5/1993 |
| JP | H5-175332 | 7/1993 |
| JP | H8-001220 | 7/1996 |
| JP | H10-012773 | 1/1998 |
| JP | 2003-086614 | 3/2003 |
| JP | 2003-249617 | 9/2003 |
| JP | 2004-035757 | 2/2004 |
| JP | 2004-217838 | 8/2004 |
| JP | 2005-116919 | 4/2005 |
| JP | 2005-239889 | 9/2005 |
| JP | 2006-312703 | 11/2006 |
| JP | 2008-095063 | 4/2008 |
| JP | 2008-131006 | 6/2008 |
| JP | 2009-044010 | 2/2009 |
| JP | 2011-190419 | 9/2011 |
| JP | 2012-059846 | 3/2012 |
| JP | 2016-196322 | 11/2016 |
| KR | 10-2002-0044586 | 6/2002 |
| KR | 10-2002-0060143 | 7/2002 |
| KR | 10-2011-0097798 | 8/2011 |
| KR | 10-2017-0007327 | 1/2017 |
| SG | 11202001674 W | 9/2019 |
| TW | 200423316 | 11/2004 |
| TW | 200932860 | 8/2009 |
| TW | 201443193 | 11/2014 |
| WO | 01/035460 | 5/2001 |
| WO | 2004/075293 | 9/2004 |
| WO | 2009/044732 | 4/2009 |
| WO | 2017/149925 | 9/2017 |
| WO | 2017/164352 | 9/2017 |
| WO | 2017/169747 | 10/2017 |
| WO | 2018/181536 | 10/2018 |
| WO | 2018/207408 | 11/2018 |

OTHER PUBLICATIONS

International Search Report dated Feb. 4, 2020 for PCT/JP2019/043750.
International Search Report dated Apr. 24, 2018 for PCT/JP2018/002313.
International Search Report dated Apr. 2, 2019 for PCT/JP2019/008205.
International Search Report dated Nov. 12, 2019 for PCT/JP2019/036407.
International Search Report dated Sep. 8, 2020 for PCT/JP2020/023647.
International Preliminary Report on Patentability with Written Opinion dated Mar. 31, 2022 for PCT/JP2019/036407.
International Preliminary Report on Patentability with Written Opinion dated Dec. 30, 2021 for PCT/JP2020/023647.
Soei Patent and Law Firm, Statement of Related Matters, dated Jun. 6, 2025.

* cited by examiner

TEMPORARY PROTECTIVE FILM FOR PRODUCING SEMICONDUCTOR DEVICE, REEL BODY, AND METHOD FOR PRODUCING SEMICONDUCTOR DEVICE

CROSS-REFERENCE TO RELATED APPLICATIONS

This application is a 35 U.S.C. § 371 national phase application of PCT/JP2019/043750, filed on Nov. 7, 2019, which claims priority to Japanese Patent Application No. 2018-211552, filed on Nov. 9, 2018.

TECHNICAL FIELD

The present invention relates to a temporary protective film for producing a semiconductor device, a reel body, and a method for producing a semiconductor device.

BACKGROUND ART

Semiconductor packages having a structure in which a sealing layer sealing a semiconductor element is provided only on one surface side of a substrate for a semiconductor such as a lead frame and an organic substrate and the rear surface of the substrate for a semiconductor is exposed have been proposed. The semiconductor packages having such structure are produced, for example, by a method in which a temporary protective film having an adhesive layer is attached to the rear surface of a substrate for a semiconductor having an opening to temporarily protect the rear surface of the substrate for a semiconductor, a semiconductor element mounted on the front surface side of the substrate for a semiconductor is sealed in this state, and then the temporary protective film is peeled off. Using the temporary protective film can prevent defects that a sealing resin sneaks to the rear surface of the substrate for a semiconductor during sealing molding, or the like (for example, Patent Literature 1).

CITATION LIST

Patent Literature

Patent Literature 1: International Publication WO 2001/035460

SUMMARY OF INVENTION

Technical Problem

It is desirable that a temporary protective film to be used in production of a semiconductor device can be attached to a substrate for a semiconductor at normal temperature and can be easily peeled off from the substrate for a semiconductor after being heated at a high temperature. However, in the case of a temporary protective film having relatively satisfactory attachment properties at normal temperature, for example, after heating the temporary protective film at a temperature of 180° C. or higher, the temporary protective film is difficult to be peeled off from the substrate for a semiconductor, or a part of the adhesive layer remains on the substrate for a semiconductor or on the sealing layer in some cases after peeling off the temporary protective film.

In this regard, the present invention provides a temporary protective film for producing a semiconductor device, the temporary protective film capable of being easily attached to a substrate for a semiconductor at normal temperature and capable of being easily peeled off after being heated at a high temperature while occurrence of a residue on a substrate for a semiconductor and a sealing layer is suppressed.

Solution to Problem

An aspect of the present invention relates to a temporary protective film for producing a semiconductor device, the temporary protective film being used for temporarily protecting a surface of a substrate for a semiconductor that is opposite to a surface on which a semiconductor element is mounted, in a method for producing a semiconductor device having the substrate for a semiconductor and the semiconductor element mounted on the substrate for a semiconductor. The temporary protective film includes a support film and an adhesive layer provided on one surface or both surfaces of the support film. The adhesive layer contains acrylic rubber. When the temporary protective film is attached to a copper alloy plate having a copper alloy surface at 25° C. so that the adhesive layer is in contact with the copper alloy plate, and a laminate thus obtained is sequentially heated at 180° C. for 60 minutes and at 200° C. for 60 minutes, a 90-degree peeling strength of the temporary protective film against the copper alloy plate is 5 N/m or more at 25° C. before heating the laminate and 150 N/m or less at 50° C. after heating the laminate.

Another aspect of the present invention relates to a reel body including a reel having a tubular wind-up unit and the above-described temporary protective film for producing a semiconductor device, the temporary protective film being wound up around the wind-up unit.

Still another aspect of the present invention relates to a method for producing a semiconductor device, the method including, in the following order, a step of attaching the above-described temporary protective film for producing a semiconductor device to one surface of a substrate for a semiconductor in a direction in which the adhesive layer comes into contact with the substrate for a semiconductor, a step of mounting a semiconductor element on a surface of the substrate for a semiconductor that is opposite to the temporary protective film, a step of forming a sealing layer sealing the semiconductor element to obtain a sealing molded body having the substrate for a semiconductor, the semiconductor element, and the sealing layer, and a step of peeling off the temporary protective film from the sealing molded body.

Advantageous Effects of Invention

According to the present invention, there is provided a temporary protective film for producing a semiconductor device, the temporary protective film capable of being easily attached to a substrate for a semiconductor at normal temperature and capable of being easily peeled off after being heated at a high temperature while occurrence of a residue on a sealing layer is suppressed.

DESCRIPTION OF EMBODIMENTS

Hereinafter, preferred embodiments of the present invention will be specifically described. However, the present invention is not limited to the following embodiments. Upper limit values and lower limit values in the numerical range described in the present specification can be arbitrarily combined. Values described in Examples can also be used as upper limit values or lower limit values in the numerical range. In the present specification, "(meth)acrylic acid" means "acrylic acid" and "methacrylic acid".

Temporary Protective Film

Figure 1:
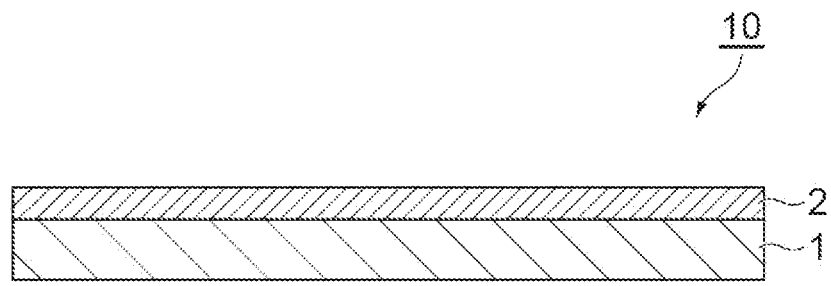
FIG. 1 is a cross-sectional view illustrating an embodiment of a temporary protective film.

FIG. 1 is a cross-sectional view illustrating a temporary protective film according to an embodiment. A temporary protective film 10 illustrated in FIG. 1 is composed of a support film 1 and an adhesive layer 2 provided on one surface of the support film 1. An adhesive layer may be formed on both surfaces of the support film 1. This temporary protective film is used for temporarily protecting a surface of a semiconductor substrate that is opposite to a surface on which a semiconductor element is mounted, in a method for producing a semiconductor device having the semiconductor substrate and the semiconductor element mounted on the semiconductor substrate. For example, during a step of forming a sealing layer sealing a semiconductor element mounted on a semiconductor substrate (for example, a lead frame), the temporary protective film is attached to the semiconductor substrate so that the semiconductor substrate can be temporarily protected.

The adhesive layer 2 contains acrylic rubber. The acrylic rubber is generally a copolymer containing (meth)acrylic acid alkyl ester as a main monomer unit. The ratio of the monomer unit ((meth)acrylic acid alkyl ester unit) derived from (meth)acrylic acid alkyl ester in the acrylic rubber may be 50% by mass or more with respect to the entire acrylic rubber. The (meth)acrylic acid alkyl ester constituting the acrylic rubber may be, for example, at least one selected from the group consisting of n-butyl (meth)acrylate, ethyl (meth)acrylate, and methyl (meth)acrylate.

Examples of a monomer other than the (meth)acrylic acid alkyl ester constituting the acrylic rubber include (meth)acrylic acid, 2-hydroxyethyl (meth)acrylate, and acrylonitrile. The acrylic rubber may be a copolymer including a (meth)acrylic acid alkyl ester unit, a (meth)acrylic acid unit and/or a 2-hydroxyethyl acrylate unit, and an acrylonitrile unit, and may be a copolymer including a (meth)acrylic acid alkyl ester unit, a (meth)acrylic acid unit and/or a 2-hydroxyethyl acrylate unit, an acrylonitrile unit, and a glycidyl (meth)acrylate unit. By using the acrylic rubber mainly configured from these monomer units, a temporary protective film having a predetermined adhesive force described below can be particularly easily obtained. The total ratio of the (meth)acrylic acid alkyl ester unit having an alkyl group not having a substituent, the (meth)acrylic acid unit, the 2-hydroxyethyl acrylate unit, and the acrylonitrile unit, or the total ratio of the (meth)acrylic acid alkyl ester unit having an alkyl group not having a substituent, the (meth)acrylic acid unit, the 2-hydroxyethyl acrylate unit, the acrylonitrile unit, and the glycidyl (meth)acrylate unit may be 90% by mass or more, 95% by mass or more, or 97% by mass or more with respect to a total mass of the acrylic rubber.

From the viewpoint of maintaining the attachment properties of the adhesive layer at normal temperature, the glass transition temperature (Tg) of the acrylic rubber may be −70° C. to 40° C., −60° C. to 30° C., or −50° C. to 20° C. Herein, the glass transition temperature of the acrylic rubber means a value measured by differential scanning calorimetric measurement, differential thermal measurement, dynamic viscoelasticity measurement, or thermomechanical analysis. The glass transition temperature may be a theoretical value obtained from the type of the monomer unit and the copolymerization ratio.

The weight average molecular weight of the acrylic rubber may be affected by the cohesion force of the adhesive layer. In an adhesive layer having a weak cohesion force, there is a tendency that a residue is likely to be generated on the sealing layer after peeling-off. From this viewpoint, the weight average molecular weight of the acrylic rubber may be 50000 or more, 100000 or more, or 150000 or more, and may be 900000 or less. The weight average molecular weight of the acrylic rubber described herein means a value measured by gel permeation chromatography.

As the acrylic rubber, a product purchased as a commercially available product may be used without departing from the gist of the present invention. Examples of a commercially available product of the acrylic rubber include HTR-280 DR (manufactured by Nagase ChemteX Corporation, weight average molecular weight: 800000 to 900000) and WS-023 EK30 (manufactured by Nagase ChemteX Corporation, weight average molecular weight: 450000 to 500000). Two or more kinds of these acrylic rubbers may be used in combination.

The content of the acrylic rubber in the adhesive layer 2 may be 50% by mass or more, 60% by mass or more, 70% by mass or more, or 80% by mass or more, and may be 100% by mass or less, on the basis of the mass of the adhesive layer 2.

The temporary protective film 10 has a predetermined adhesive force against a semiconductor substrate after attachment to the semiconductor substrate at normal temperature and after the subsequent heating treatment. The adhesive force of the temporary protective film 10 against the semiconductor substrate can be evaluated by the 90-degree peeling strength of the temporary protective film 10 against a copper alloy plate having a copper alloy surface, assuming a lead frame as an example of the semiconductor substrate. Specifically, when the temporary protective film 10 is attached to a copper alloy plate at 25° C. so that the adhesive layer 2 is in contact with the copper alloy plate, and the obtained laminate is sequentially heated at 180° C. for 60 minutes and at 200° C. for 60 minutes, a 90-degree peeling strength of the temporary protective film against the copper alloy plate is 5 N/m or more at 25° C. before heating the laminate and 150 N/m or less at 50° C. after heating the laminate. The 90-degree peeling strength before the laminate is sequentially heated at 180° C. for 60 minutes and at 200° C. for 60 minutes is referred to as the "adhesive force after attachment at normal temperature" in some cases. The 90-degree peeling strength after the laminate is sequentially heated at 180° C. for 60 minutes and at 200° C. for 60 minutes is referred to as the "adhesive force after the heating treatment" in some cases.

In order to obtain the above-described laminate, for example, a temporary protective film having a size of 40 mm×160 mm is pressure-bonded to a copper alloy plate by a load of 20 N in an environment of 25° C. The copper alloy plate has, for example, a size of 50 mm×157 mm. The copper alloy constituting the copper alloy plate may be, for example, a Cu—Fe—P-based alloy such as CDA194. As the copper alloy plate, a plate which is not covered by palladium plating or the like and has a copper alloy outermost layer is used. The 90-degree peeling strength is the maximum value of the load (N/m) per width of 10 mm of the adhesive layer of the temporary protective film when the temporary protective film attached to the copper alloy plate is torn off in the 90° direction against the principal surface of the copper alloy plate. The tearing-off speed is 50 mm/min. The adhesive force after the attachment at normal temperature is measured in an environment of 25° C. The adhesive force after the heating treatment is measured in an environment of 50° C.

The adhesive force of the temporary protective film after attachment at normal temperature may be 10 N/m or more, 20 N/m or more, or 30 N/m or more, and may be 200 N/m or less or 150 N/m or less at 25° C. The adhesive force of the temporary protective film after the heating treatment may be 100 N/m or less or 90 N/m or less, and may be 10 N/m or more at 50° C.

The adhesive layer 2 may further contain a peelability imparting agent. By using the adhesive layer containing a combination of the acrylic rubber and the peelability imparting agent, the temporary protective film having the predetermined adhesive force mentioned above can be particularly easily obtained. The peelability imparting agent is a component which lowers the adhesive force of the heated adhesive layer against the substrate for a semiconductor or the sealing layer as compared to a case where the adhesive layer does not contain the peelability imparting agent. When the peelability imparting agent is added to the adhesive layer, a change in state of the outermost surface of the adhesive layer occurs, for example, an interaction with the semiconductor substrate is weakened by the influence of the functional group existing on the surface, or surface free energy changes to lower wettability.

The peelability imparting agent can contain, for example, an aliphatic compound having a linear, branched, or alicyclic hydrocarbon group. The aliphatic compound may have at least one functional group selected from an epoxy group, a hydroxyl group, and an amino group. The aliphatic compound may have at least one functional group selected from an amino group, a carboxy group, an isocyanate group, and an ureido group. In particular, the peelability imparting agent may contain an aliphatic epoxy compound having an aliphatic group and a glycidyl ether group bonded to the aliphatic group. The aliphatic epoxy compound may have two or more epoxy groups and may further have a hydroxyl group. The aliphatic epoxy compound may have a hydrocarbon group having 2 to 10 carbon atoms. As an example of the aliphatic epoxy compound which may be used as the peelability imparting agent, at least one aliphatic compound (or aliphatic epoxy resin) selected from the group consisting of sorbitol polyglycidyl ether, ethylene glycol diglycidyl ether, and glycerol polyglycidyl ether may be included. These aliphatic compounds may be used alone or may be used in combination of two or more kinds thereof.

The peelability imparting agent may be a compound having an alkoxysilyl group. The compound having an alkoxysilyl group is, for example, represented by Formula (1) below.

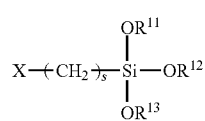

(1)

In Formula (1), "X" represents a phenyl group, a glycidoxy group, an acryloyloxy group, a methacryloyloxy group, a mercapto group, an amino group, a vinyl group, or an isocyanate group, "s" represents an integer of 0 to 10, and $R^{11}$, $R^{12}$, and $R^{13}$ each independently represent an alkyl group having 1 to 10 carbon atoms. Examples of the alkyl group having 1 to 10 carbon atoms represented by $R^{11}$, $R^{12}$, or $R^{13}$ include a methyl group, an ethyl group, a propyl group, a butyl group, a pentyl group, a hexyl group, a heptyl group, an octyl group, a nonyl group, a decyl group, an isopropyl group, and an isobutyl group. $R^{11}$, $R^{12}$, and $R^{13}$ may each independently be a methyl group, an ethyl group, or a pentyl group. From the viewpoint of heat resistance, X may be an amino group, a glycidoxy group, a mercapto group, or an isocyanate group, and may a glycidoxy group or a mercapto group.

The total content of the peelability imparting agent may be 0.1 parts by mass or more and less than 50 parts by mass, 40 parts by mass or less, 35 parts by mass or less, or 30 parts by mass or less, may be 1 part by mass or more and less than 50 parts by mass, 40 parts by mass or less, 35 parts by mass or less, or 30 parts by mass or less, may be 3 parts by mass or more and less than 50 parts by mass, 40 parts by mass or less, 35 parts by mass or less, or 30 parts by mass or less, may be 5 parts by mass or more and less than 50 parts by mass, 40 parts by mass or less, 35 parts by mass or less, or 30 parts by mass or less, and may be 7 parts by mass or more and less than 50 parts by mass, 40 parts by mass or less, 35 parts by mass or less, or 30 parts by mass or less, with respect to 100 parts by mass of the acrylic rubber. When the content of the peelability imparting agent is within these numerical ranges, the temporary protective film having the predetermined adhesive force mentioned above is particularly easily obtained. The content of the acrylic rubber and the peelability imparting agent may be 80 to 100% by mass, 90 to 100% by mass, or 95 to 100% by mass, on the basis of the mass of the adhesive layer.

The adhesive layer 2 may further contain other components. Examples of the other components include an antioxidant, an ultraviolet absorber, a filler (for example, an inorganic filler, conductive particles, or a pigment), a lubricant such as wax, a tackifier, a plasticizer, a curing accelerator, and a fluorescent dye.

The thickness of the adhesive layer 2 may be, for example, 1 to 100 When the adhesive layer 2 is thick, there is a tendency that a residual material of the adhesive layer after peeling-off is further suppressed. Therefore, the thickness of the adhesive layer 2 may be 2 μm or more, 5 μm or more, 6 μm or more, or 8 μm or more. From the viewpoint of suppressing defects in wire bonding, or the like, the thickness of the adhesive layer 2 may be 80 μm or less or 60 μm or less. When the thickness of the adhesive layer 2 is less than 2 μm, the adhesive force is insufficient so that a defect that the adherend is peeled off in the course of processing may occur. The thickness of the adhesive layer 2 may be 2 μm or more and 80 μm or less, or 60 μm or less, may be 5 or more and 80 μm or less, or 60 μm or less, may be 6 μm or more and 80 μm or less, or 60 μm or less, and may be 8 μm or more and 80 μm or less, or 60 μm or less.

The support film 1 may be, for example, a film of an aromatic polyimide, an aromatic polyamide, an aromatic polyamideimide, an aromatic polysulfone, an aromatic polyethersulfone, polyphenylene sulfide, an aromatic polyether ketone, polyallylate, an aromatic polyether ether ketone, or polyethylene naphthalate.

The linear thermal expansion coefficient of the support film 1 at 20° C. to 200° C. may be $3.0 \times 10^{-5}$/° C. or less. The heating shrinkage ratio when the support film 1 is heated at 200° C. for 2 hours may be 0.15% or less. For example, an aromatic polyimide film has these characteristics in many cases.

The support film 1 may be subjected to a surface treatment such as a plasma treatment, a corona treatment, or a primer treatment.

From the viewpoint of suppressing warpage of a semiconductor substrate after the temporary protective film is attached to the semiconductor substrate, the thickness of the support film 1 may be 200 or less, 100 μm or less, or 50 μm or less, and may be 10 μm or more.

The temporary protective film may further include a cover film covering the surface of the adhesive layer 2 that is opposite to the support film 1. The cover film may be, for example, a polyethylene terephthalate film (PET). The cover film may have a peelable layer. The thickness of the cover film may be 10 to 100 μm or 20 to 100 μm.

The temporary protective film 10 can be obtained, for example, by a method including applying a varnish containing acrylic rubber, a solvent such as cyclohexanone or methyl ethyl ketone, and as necessary, other components such as a peelability imparting agent to the support film 1 and removing the solvent from the coating film by heating to form the adhesive layer 2 on the support film 1.

The method of applying the varnish to the support film is not particularly limited, and examples thereof include methods using roll coating, reverse roll coating, gravure coating, bar coating, comma coating, die coating, or reduced pressure die coating.

An elongated temporary protective film may be wound up around a reel, and a semiconductor device may be produced while the temporary protective film is unwound from the obtained reel body. The reel body in this case has a reel having a tubular wind-up unit and the aforementioned temporary protective film according to the embodiment wound up around the wind-up unit.

Method for Producing Semiconductor Device

It is possible to produce, using the temporary protective film according to an embodiment, a semiconductor device having, for example, a lead frame as an example of a semiconductor substrate, a semiconductor element mounted thereon, and a sealing layer sealing the semiconductor element on the semiconductor element side of the lead frame, in which the rear surface of the lead frame is exposed for external connection. The semiconductor device having such a configuration may be called a Non Lead Type Package. Specific examples thereof include QFN (QuadFlat Non-leaded Package) and SON (Small Outline Non-leaded Package).

Figure 2:
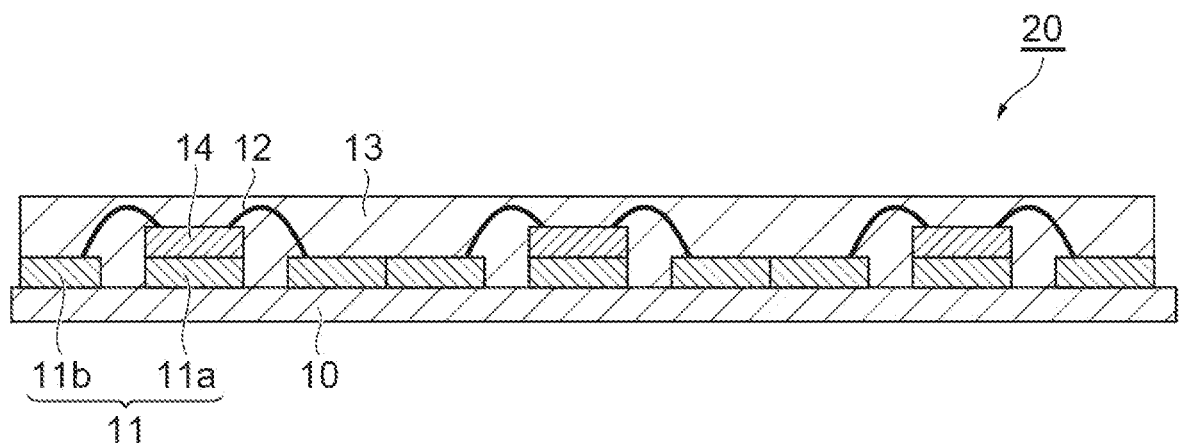
FIG. 2 is a cross-sectional view illustrating an embodiment of a method for producing a semiconductor device.
Figure 3:
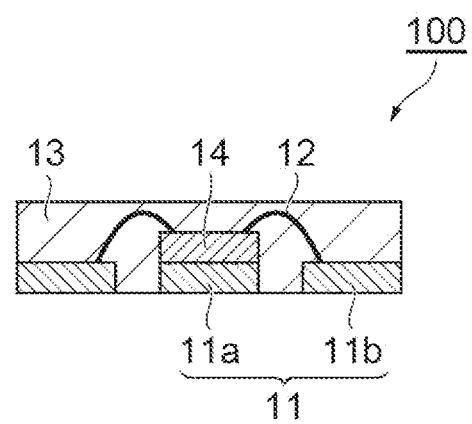
FIG. 3 is a cross-sectional view illustrating an embodiment of a method for producing a semiconductor device.

Hereinafter, the method for producing a semiconductor device will be specifically described with reference to the drawings. However, a semiconductor device obtained by the production method of the present embodiment is not limited to those having configurations exemplified below. FIG. 2 and FIG. 3 are cross-sectional views illustrating a method for producing a semiconductor device according to an embodiment of the present invention. The method according to the embodiments of FIG. 2 and FIG. 3 includes a step of attaching the temporary protective film 10 to one surface (rear surface) of the lead frame 11 having a plurality of die pads 11a and an inner lead 11b in a direction in which the adhesive layer 2 comes into contact with the lead frame 11, a step of adhering (mounting) the semiconductor element 14 to the die pad 11a, a step of providing a wire 12 connecting the semiconductor element 14 and the inner lead 11b, a step of forming a sealing layer 13 covering the surface of the lead frame 11 on the semiconductor element 14 side, the semiconductor element 14, and the wire 12 to obtain the sealing molded body 20 having the lead frame 11, the semiconductor element 14, and the sealing layer 13, a step of peeling off the temporary protective film 10 from the sealing molded body 20, and a step of dividing the sealing molded body 20 to obtain a plurality of semiconductor devices 100 each having one semiconductor element 14.

Attachment of the temporary protective film 10 to the lead frame 11 can be performed at normal temperature (for example, 5° C. to 35° C.). The attachment method is not particularly limited, and may be, for example, a roll lamination method.

The material for the lead frame 11 is not particularly limited, and may be, for example, an iron-based alloy such as Alloy 42, copper, or a copper alloy. In the case of using lead frames of copper and a copper alloy, the surface of the lead frames may be subjected to a coating treatment of palladium, gold, silver, or the like. In order to improve the sticking force with the sealing material, the surface of the lead frame may be physically roughening-treated. The surface of the lead frame may also be subjected to a chemical treatment such as an epoxy bleed-out (EBO) prevention treatment of preventing bleed-out of a silver paste.

The semiconductor element 14 is usually adhered to the die pad 11a through an adhesive (for example, a silver paste). The adhesive may be cured by a heating treatment (for example, 140° C. to 200° C., 30 minutes to 2 hours).

The wire 12 is not particularly limited, and may be, for example, a gold wire, a copper wire, or an aluminum or palladium-coated copper wire. For example, a semiconductor element and an inner lead may be joined with the wire 12 by heating at 200° C. to 270° C. for 3 to 60 minutes and utilizing ultrasonic waves and a pressing pressure.

After wire bonding with the wire 12 and before the step of forming the sealing layer 13, the lead frame 11 may be subjected to a plasma treatment. Through the plasma treatment, the adhesiveness between the sealing layer and the lead frame can be further increased, and thereby, reliability of the semiconductor device can be further improved. As the plasma treatment, for example, a method of injecting a gas such as argon, nitrogen, or oxygen in a predetermined gas flow rate under reduced pressure conditions (for example, 10 Pa or less), and performing plasma irradiation may be mentioned. The irradiation output of the plasma in the plasma treatment may be, for example, 10 to 500 W. The time for the plasma treatment may be, for example, 5 to 50 seconds. The gas flow rate in the plasma treatment may be 5 to 50 sccm.

In the step of sealing molding, the sealing layer 13 is formed using a sealing material. Through the sealing molding, the sealing molded body 20 having the plurality of semiconductor elements 14 and the sealing layer 13 integrally sealing these semiconductor elements is obtained. Since the temporary protective film 10 is provided during the sealing molding, the sealing material is inhibited from sneaking to the rear surface side of the lead frame 11.

The temperature during the formation of the sealing layer 13 (sealing temperature) may be 140° C. to 200° C., and may be 160° C. to 180° C. The pressure during the formation of the sealing layer (sealing pressure) may be 6 to 15 MPa, and may be 7 to 10 MPa. The heating time for the sealing molding (sealing time) may be 1 to 5 minutes, and may be 2 to 3 minutes.

The material for the sealing material is not particularly limited, and examples thereof include epoxy resins such as a cresol novolac epoxy resin, a phenol novolac epoxy resin, a biphenyl diepoxy resin, and a naphthol novolac epoxy resin. The sealing material may contain additive materials such as a filler, a flame retardant substance (for example, a brominated compound), and a wax.

After the formation of the sealing layer 13, the temporary protective film 10 is peeled off from the lead frame 11 and the sealing layer 13 of the sealing molded body 20 thus obtained. In the case of curing the sealing layer 13, the temporary protective film 10 may be peeled off at any time point before or after curing of the sealing layer 13.

The temperature at the time of peeling off the temporary protective film 10 is not particularly limited, and may be normal temperature (for example, 5° C. to 35° C.). This temperature may be higher than or equal to the glass transition temperature of the adhesive layer. In this case, the peelability of the temporary protective film against the lead frame and the sealing layer becomes more satisfactory. When the Tg of the acrylic rubber in the adhesive layer is, for example, 5° C. or lower, or 0° C. or lower, satisfactory peelability at normal temperature is easily obtained.

A semiconductor device produced using the temporary protective film according to an embodiment is excellent in view of density increase, area reduction, thickness reduction, and the like. Thus, the semiconductor device can be utilized in, for example, electronic equipment such as mobile phones, smart phones, personal computers, and tablets.

EXAMPLES

Hereinafter, the present invention will be described more specifically by way of Examples; however, the present invention is not intended to be limited to the following Examples.

1. Production of Temporary Protective Film
1-1. Production of Varnish for Coating A resin composition having the composition (unit: parts by mass) shown in Table 1 and cyclohexanone as a solvent were mixed, the mixture was stirred, and thereby varnishes A to E in which the concentration of the component other than the solvent was 12% by mass were obtained. The details of the acrylic rubber and the peelability imparting agent shown in the table are as follows.

Acrylic Rubber
  WS-023 EK30 (trade name, manufactured by Nagase ChemteX Corporation, weight average molecular weight: 500000, glass transition temperature (theoretical value calculated from copolymerization ratio): −10° C.)
  HTR-280 DR (trade name, manufactured by Nagase ChemteX Corporation, weight average molecular weight: 900000, glass transition temperature (theoretical value calculated from copolymerization ratio): −29° C.)

Peelability Imparting Agent
  EX-614B (trade name, manufactured by Nagase ChemteX Corporation, sorbitol polyglycidyl ether, epoxy equivalent: 174)
  EX-810 (trade name, manufactured by Nagase ChemteX Corporation, ethylene glycol diglycidyl ether, epoxy equivalent: 113)

TABLE 1

| Varnish | | A | B | C | D | E |
|---|---|---|---|---|---|---|
| Acrylic rubber | WS-023 EK30 | 70 | 70 | 70 | 100 | 0 |
| | HTR-280 DR | 30 | 30 | 30 | 0 | 100 |

TABLE 1-continued

| Varnish | | A | B | C | D | E |
|---|---|---|---|---|---|---|
| Peelability | EX-614B | 10 | 0 | 10 | 0 | 0 |
| imparting agent | EX810 | 0 | 10 | 10 | 0 | 0 |

1-2. Temporary Protective Film

An aromatic polyimide film (manufactured by Ube Industries, Ltd., trade name: UPILEX 25SGADS, film thickness: 25 μm) was prepared as a support film. The varnish A, B, C, D, or E was applied onto this support film. The coating film was dried by heating at 90° C. for 2 minutes and at 180° C. for 2 minutes to form an adhesive layer having a thickness of 2, 6, 10, or 60 μm, thereby obtaining temporary protective films of Examples 1 to 9 and Comparative Examples 1 and 2. The combination of the varnish and the thickness of the adhesive layer in each of Examples and Comparative Examples is as shown in Table 2.

2. Evaluation
2-1. Adhesive Force of Adhesive Layer
(1) Adhesive Force after Attachment at Normal Temperature As adherends, a CDA194 plate (Cu—Fe—P-based alloy, manufactured by SHINKO ELECTRIC INDUSTRIES CO., LTD.) and a CDA194 palladium-plated plate (PPF, manufactured by SHINKO ELECTRIC INDUSTRIES CO., LTD.) were prepared. These lead frames had a size of 50 mm×157 mm. To these lead frames, each temporary protective film cut into a size of 40 mm×160 mm was attached using a hand roller, in a direction in which the adhesive layer came into contact with the lead frame, under the conditions of 25° C. and a load of 20 N. Subsequently, each temporary protective film was torn off using a force gauge at a speed of 50 mm/min in the 90° direction against the principal surface of the lead frame at 25° C. The maximum value (N/m) of the load per width of 10 mm of the adhesive layer at that time was recorded as the adhesive force (90-degree peeling strength) after attachment at normal temperature.

(2) Adhesive Force after Heating Treatment

As adherends, a CDA194 plate (Cu—Fe—P-based alloy, manufactured by SHINKO ELECTRIC INDUSTRIES CO., LTD.) and a CDA194 palladium-plated plate (PPF, manufactured by SHINKO ELECTRIC INDUSTRIES CO., LTD.) were prepared. These lead frames had a size of 50 mm×157 mm. To these lead frames, each temporary protective film cut into a size of 40 mm×160 mm was attached using a hand roller, in a direction in which the adhesive layer came into contact with the lead frame, under the conditions of 25° C. and a load of 20 N. The obtained laminate was subjected to a heating treatment at 180° C. for 60 minutes and at 200° C. for 60 minutes in an oven in an air atmosphere. Thereafter, the temporary protective film was torn off using a force gauge at a speed of 50 mm/min in the 90° direction against the principal surface of the lead frame at 50° C. The maximum value (N/m) of the load per width of 10 mm of the adhesive layer at that time was recorded as the adhesive force (90-degree peeling strength) after the heating treatment.

2-2. Residual Material of Adhesive Layer after Sealing Molding

Each of the temporary protective films of Examples and Comparative Examples was attached to a CDA194 frame (lead frame, manufactured by SHINKO ELECTRIC INDUSTRIES CO., LTD.) in a direction in which the adhesive layer came into contact with the lead frame, under the conditions of 25° C. and a load of 20 N. The obtained laminate was heated in an oven in an air atmosphere while the conditions were changed to the sequence of at 180° C. for 60 minutes and at 200° C. for 60 minutes. The surface of the lead frame that is opposite to the temporary protective film was subjected to a plasma treatment in an argon gas atmosphere (flow rate: 20 sccm) under the conditions of 150 W and 15 seconds.

A sealing layer was formed using a mold molding machine (manufactured by APIC YAMADA CORPORATION) by a sealing material (trade name: GE-300, manufactured by Hitachi Chemical Co., Ltd.) on the surface of the lead frame that is opposite to the temporary protective film. The sealing conditions were set to 175° C., 6.8 MPa, and 2 minutes. Thereafter, each temporary protective film was torn off at a speed of 50 mm/min in the 90° direction against the surface of the lead frame at 50° C. The state of the adhesive layer remaining on the sealing layer after the temporary protective film was torn off was checked. The ratio of the area of the residual material of the adhesive layer with respect to the area of the surface of the sealing layer was determined. The peelability after the sealing molding was evaluated according to the following 5-grade criteria on the basis of the ratio of the area of the residual material of the adhesive layer.

5: 60% to 100%
4: 40% to less than 60%
3: 20% or more and less than 40%
2: 10% or more and less than 20%
1: 0% to less than 10%

The above evaluation results are shown in Table 2. The temporary protective film of each Example could be attached to the lead frame at normal temperature and could be easily peeled off from the lead frame after the heating treatment. After the sealing molding, the temporary protective film could be peeled off from the sealing molded body while occurrence of a residue on the lead frame and the sealing layer was suppressed.

TABLE 2

|  |  | Examples | | | | | | | | | Comparative Examples | |
|---|---|---|---|---|---|---|---|---|---|---|---|---|
|  |  | 1 | 2 | 3 | 4 | 5 | 6 | 7 | 8 | 9 | 1 | 2 |
| Varnish | | A | B | C | A | B | C | A | B | C | D | E |
| Acrylic rubber | WS-023 EK30 | 70 | 70 | 70 | 70 | 70 | 70 | 70 | 70 | 70 | 100 | 0 |
|  | HTR-280 DR | 30 | 30 | 30 | 30 | 30 | 30 | 30 | 30 | 30 | 0 | 100 |
| Peelability imparting agent | EX-614B | 10 | 0 | 10 | 10 | 0 | 10 | 10 | 0 | 10 | 0 | 0 |
|  | EX810 | 0 | 10 | 10 | 0 | 10 | 10 | 0 | 10 | 10 | 0 | 0 |
| Thickness of adhesive layer [μm] | | 6 | 6 | 6 | 10 | 10 | 10 | 60 | 60 | 60 | 10 | 10 |
| Adhesive force after attachment at normal temperature [N/m] | Cu alloy | 39 | 33 | 36 | 45 | 39 | 42 | 140 | 120 | 130 | 3 | 100 |
|  | PPF | 20 | 21 | 18 | 29 | 32 | 27 | 130 | 145 | 125 | 5 | 120 |
| Adhesive force after heating treatment [N/m] | Cu alloy | 65 | 69 | 65 | 95 | 101 | 95 | 110 | 117 | 110 | 93 | 210 |
|  | PPF | 59 | 81 | 35 | 81 | 111 | 48 | 102 | 135 | 60 | 105 | 180 |
| Residual material of adhesive layer | | 3 | 3 | 3 | 2 | 2 | 2 | 2 | 2 | 2 | 5 | 5 |

REFERENCE SIGNS LIST

1: support film, 2: adhesive layer, 10: temporary protective film, 11: lead frame, 11a: die pad, 11b: inner lead, 12: wire, 13: sealing layer, 14: semiconductor element, 20: sealing molded body, 100: semiconductor device.

The invention claimed is:

1. A temporary protective film for producing a semiconductor device, the temporary protective film comprising: a support film; and an adhesive layer provided on one or more surfaces of the support film, the adhesive layer comprising an acrylic rubber and a peelability imparting agent, wherein the acrylic rubber is a copolymer comprising:
   a (meth)acrylic acid alkyl ester unit;
   a (meth)acrylic acid unit and/or a 2-hydroxyethyl acrylate unit; and
   an acrylonitrile unit as monomer units, and a total ratio of the monomer units is 90% by mass or more with respect to a total mass of the acrylic rubber, and the peelability imparting agent comprises an aliphatic epoxy compound having an aliphatic group and a glycidyl ether group bonded to the aliphatic group, and a content of the peelability imparting agent is between 1 part by mass and 30 parts by mass with respect to 100 parts by mass of the acrylic rubber, and wherein the adhesive layer is configured to have both of:

a 90-degrees peeling strength of 5 N/m or more against a copper alloy plate as determined at 25° C. when the temporary protective film is attached to the copper alloy plate having a copper alloy surface at 25° C. so that the adhesive layer is in contact with the copper alloy surface of the copper alloy plate thereby to form a laminate; and a 90-degrees peeling strength of 150 N/m or less against the copper alloy plate as determined at 50° C. after the laminate is sequentially heated at 180° C. for 60 minutes and at 200° C. for 60 minutes.

2. The temporary protective film according to claim 1, wherein a thickness of the adhesive layer is between 2 μm and 100 μm.

3. The temporary protective film according to claim 1, wherein a glass transition temperature of the acrylic rubber is −50° C. to 20° C.

4. The temporary protective film according to claim 1, wherein a weight average molecular weight of the acrylic rubber is 150000 to 900000.

5. The temporary protective film according to claim 1, further comprising a cover film covering a surface of the adhesive layer that is opposite to the support film.

6. The temporary protective film according to claim 1, wherein a thickness of the adhesive layer is between 8 μm and 80 μm.

7. The temporary protective film according to claim 1, wherein a content of the peelability imparting agent is between 7 parts by mass and 30 parts by mass with respect to 100 parts by mass of the acrylic rubber.

8. The temporary protective film according to claim 1, wherein the aliphatic epoxy compound is at least one selected from the group consisting of sorbitol polyglycidyl ether, ethylene glycol diglycidyl ether, and glycerol polyglycidyl ether.

9. A reel body comprising:
a reel having a tubular wind-up unit; and
the temporary protective film according to claim 1, the temporary protective film being wound up around the wind-up unit.

10. A method for producing the semiconductor device using the temporary protective film according to claim 1, the semiconductor device comprising a semiconductor substrate and a semiconductor element mounted on the semiconductor substrate, the method comprising:
attaching the temporary protective film to the semiconductor substrate so that the adhesive layer comes into contact with the semiconductor substrate;
mounting the semiconductor element on a surface of the semiconductor substrate that is opposite to the temporary protective film;
forming a sealing layer sealing the semiconductor element to obtain a sealing molded body having the semiconductor substrate, the semiconductor element, and the sealing layer; and
peeling off the temporary protective film from the sealing molded body.

11. The method according to claim 10, wherein the semiconductor substrate is a lead frame comprising copper or copper alloy.

* * * * *